United States Patent
Nakasaki et al.

(10) Patent No.: US 9,558,873 B2
(45) Date of Patent: Jan. 31, 2017

(54) METHOD FOR MANUFACTURING SUPERCONDUCTING WIRE, AND SUPERCONDUCTING WIRE

(75) Inventors: Ryusuke Nakasaki, Tokyo (JP); Akinobu Nakai, Tokyo (JP); Tomonori Watanabe, Nagoya (JP); Naoji Kashima, Nagoya (JP); Shigeo Nagaya, Nagoya (JP)

(73) Assignees: FURUKAWA ELECTRIC CO., LTD., Tokyo (JP); CHUBU ELECTRIC POWER COMPANY, INCORPORATED, Nagoya-shi (JP)

( * ) Notice: Subject to any disclaimer, the term of this patent is extended or adjusted under 35 U.S.C. 154(b) by 171 days.

(21) Appl. No.: 14/376,325

(22) PCT Filed: Feb. 1, 2012

(86) PCT No.: PCT/JP2012/052274
§ 371 (c)(1),
(2), (4) Date: Aug. 1, 2014

(87) PCT Pub. No.: WO2013/114588
PCT Pub. Date: Aug. 8, 2013

(65) Prior Publication Data
US 2015/0005175 A1   Jan. 1, 2015

(51) Int. Cl.
*H01B 12/06* (2006.01)
*H01F 6/06* (2006.01)
(Continued)

(52) U.S. Cl.
CPC ............. *H01F 6/06* (2013.01); *H01B 12/06* (2013.01); *H01F 41/048* (2013.01);
(Continued)

(58) Field of Classification Search
None
See application file for complete search history.

(56) References Cited

U.S. PATENT DOCUMENTS

| 5,206,216 A | 4/1993 | Yoshida |
| 5,422,338 A * | 6/1995 | Watanabe ............. H01L 39/128 257/E39.011 |

(Continued)

FOREIGN PATENT DOCUMENTS

| CN | 1739171 A | 2/2006 |
| EP | 0 398 374 A2 | 11/1990 |

(Continued)

OTHER PUBLICATIONS

Machine translation of JP2003-036744, pp. 1-13.*

(Continued)

*Primary Examiner* — Colleen Dunn
(74) *Attorney, Agent, or Firm* — Oblon, McClelland, Maier & Neustadt, L.L.P.

(57) ABSTRACT

A method for manufacturing a superconducting wire material in which the superconducting current is not saturated even when a superconducting layer is made into a thick film, and a superconducting wire material. In the method a superconducting layer is formed on a metal substrate interposed by an intermediate layer, the method including heating the metal substrate up to the film-formation temperature of a superconducting film for forming the superconducting layer, forming a superconducting film having a film thickness of at least 10 nm and no more than 200 nm on the intermediate layer, and reducing the metal substrate temperature to a level below the film-formation temperature of the superconducting film, and the superconducting film-formation, including the heating, the film-formation, and the cooling, are performed a plurality of times.

5 Claims, 7 Drawing Sheets

(51) Int. Cl.
H01L 39/24 (2006.01)
H01F 41/04 (2006.01)
H01L 39/14 (2006.01)

(52) U.S. Cl.
CPC ........ *H01L 39/143* (2013.01); *H01L 39/2441* (2013.01); *H01L 39/2461* (2013.01)

(56) References Cited

U.S. PATENT DOCUMENTS

| | | |
|---|---|---|
| 5,908,507 A | 6/1999 | Onabe et al. |
| 2004/0016401 A1* | 1/2004 | Ignatiev .............. C23C 16/0209 118/718 |
| 2006/0062900 A1 | 3/2006 | Selvamanickam |
| 2006/0063680 A1 | 3/2006 | Ignatiev et al. |

FOREIGN PATENT DOCUMENTS

| | | |
|---|---|---|
| EP | 0398374 * | 11/1990 |
| EP | 0 744 474 A1 | 11/1996 |
| JP | 02 279597 | 11/1990 |
| JP | 2003-036744 * | 2/2003 |
| JP | 2003-36744 | 2/2003 |
| JP | 2004 536218 | 12/2004 |
| JP | 2006 233266 | 9/2006 |
| JP | 2010-121205 | 6/2010 |
| JP | 2011 60769 | 3/2011 |

OTHER PUBLICATIONS

Combined Chinese Office Action and Search Report issued Dec. 25, 2015 in Patent Application No. 201280068316.3 (with English language translation).

Z. Sefrioui, et al., "Superconductivity depression in ultrathin $YBa_2CU_3O_{7-x}$ layers in $La_{0.7}Ca_{0.3}MnO_3/YBa_2CU_3O_{7-x}$, superlattices" Applied Physics Letters, vol. 81, No. 24, Dec. 9, 2002, pp. 4568-4570.

Extended European Search Report issued Feb. 10, 2015 in Patent Application No. 12867026.2.

Kazunori Onabe, et al., "Superconducting property of $Y_1Ba_2Cu_3O_x$ films formed on silver substrates by continuous chemical vapor deposition technique" IEEE Transactions on Applied Superconductivity, vol. 11, No. 1, XP011091002, Mar. 2001, pp. 3150-3153.

Japanese Office Action issued Jul. 29, 2014, in Japan Patent Application No. 2010-198472 (with English translation).

International Search Report Issued May 1, 2012 in PCT/JP12/052274 filed Feb. 1, 2012.

Japanese Office Action issued Oct. 14, 2014, in Japan Patent Application No. 2010-198472 (with English translation).

Combined Chinese Office Action and Search Report issued Aug. 2, 2016 in Patent Application No. 201280068316.3 (with English language translation).

* cited by examiner

METHOD FOR MANUFACTURING SUPERCONDUCTING WIRE, AND SUPERCONDUCTING WIRE

TECHNICAL FIELD

This invention relates to a method for manufacturing a superconducting wire and a superconducting wire used in superconducting devices such as superconducting cables and superconducting magnets. Specifically, this invention relates to a method for manufacturing a Y-based superconducting wire and a Y-based superconducting wire.

BACKGROUND ART

Conventionally, an RE-based superconductor (RE: rare earth element) is known as a type of high temperature superconductor showing superconductivity at a liquid nitrogen temperature (77K) or higher. Specifically, a typical one is an yttrium-based superconductor (hereinafter referred to as "Y-based superconductor" or "YBCO") represented by a chemical formula $YBa_2CU_3O_{7-y}$.

Superconducting wire using a Y-based superconductor (hereinafter referred to as "Y-based superconducting wire") usually includes a layered structure with the following layers formed in order, a tape shaped metallic substrate, an intermediate layer, a Y-based superconductor layer, and a stabilizing layer. For example, this Y-based superconducting wire is manufactured by deposition of biaxially oriented intermediate layer by a IBAD (Ion Beam Assisted Deposition) on a low magnetic non-oriented metallic substrate (for example, Hastelloy (registered trademark)) and deposition of a Y-based superconducting layer on the intermediate layer by a Pulsed Laser Deposition (PLD), a Metal Organic Chemical Vapor Deposition (MOCVD) or the like (for example, see Patent Documents 1 and 2).

PRIOR ART DOCUMENT

Patent Document

Patent Document 1: Japanese Patent Application Laid-Open Publication No. 2006-233266
Patent Document 2: Japanese Patent Application Laid-Open Publication (Translation of PCT application) No. 2004-536218

DISCLOSURE OF THE INVENTION

Problems to be Solved by the Invention

The technique described in Patent Document 1 uses a technique called a PLD. The PLD is a method where an industrial laser is irradiated on a superconductor target material, the target material is instantaneously vaporized, and a superconducting layer is deposited on a surface of an intermediate layer on a metallic substrate. In order to prepare long Y-based superconducting tapes, a large amount of time and material are necessary for film deposition throughout a long tape, and the laser itself needs to be handled for a long time. The amount of time for film deposition is determined unambiguously from the continuous driving time of the laser, and the laser, which is durable for industrial use, is extremely expensive. Therefore, there is a problem that the apparatus itself becomes extremely expensive.

In Patent Document 2, a technique called MOCVD was described. The unit price of the apparatus itself can be made cheaper compared to PLD, and MOCVD can perform for a long time. When the superconducting layer becomes thicker, the superconducting properties (For example, critical current. Hereinafter, the critical current is referred to as "Ic".) improves linearly until a certain film thickness. However, there is a problem that when the film thickness becomes thicker than the certain film thickness, the superconducting current becomes saturated. This is due to crystallinity of the superconducting layer. The superconducting current flows parallel to c-axis oriented crystals of the YBCO. However, when the YBCO crystals are deposited thicker, an anisotropic crystal including a-axis oriented crystals and b-axis oriented one increase in number and size than the c-axis oriented one, and a connection of the c-axis oriented crystals is divided or growth of c-axis oriented one is suppressed. Therefore, when the film is deposited to a certain film thickness or more, a superconducting layer does not contribute to increase of the superconducting current.

Here, in order to obtain a good Ic when the superconducting layer becomes thicker, the growth in c-axis oriented crystals is essential. However, as described above, with the MOCVD, crystals in the a-axis, b-axis and other orientations called anisotropic crystals tend to increase when the film thickness becomes a certain film thickness or more. Such anisotropic crystals do not contribute to the Ic and rather become the reason for decrease of Ic. Anisotropic crystals tend to be formed on polycrystal of $Cu_xO$, etc. and have a growth rate faster compared to c-axis oriented crystals. Then, once the anisotropic crystals are formed, the growth is accelerated than the growth of the c-axis oriented crystals. Therefore, there is a problem that the anisotropic crystals grow as a superconducting layer which does not contribute to improving the Ic.

The object of this invention is to provide a method for manufacturing a superconducting wire and a superconducting wire in which a superconducting current is not saturated even when a superconducting layer becomes thicker.

Means for Solving the Problem

In order to solve the above problems, this invention provides a method for manufacturing a superconducting wire in which a superconducting layer is formed above a metallic substrate with an intermediate layer in between, the method including:
heating the metallic substrate to a film deposition temperature of a superconducting thin film which forms the superconducting layer;
depositing the superconducting thin film with a film thickness of 10 nm or more and 200 nm or less on the intermediate layer; and
cooling the metallic substrate temperature below the film deposition temperature of the superconducting thin film,
wherein forming the superconducting thin film which includes the heating, the depositing, and the cooling is performed plural times.

According to this invention, a superconducting wire in which a superconducting layer is formed above a metallic substrate with intermediate layers will be able to provided, as in between,
wherein the superconducting layer includes plural superconducting thin films; and
a film thickness of each of the plural superconducting thin films is 10 nm or more and 200 nm or less.

Advantageous Effect of the Invention

According to this invention, it makes possible to provide a manufacturing method of a superconducting wire and a superconducting wire in which a superconducting critical current is not saturated even when a superconducting layer becomes thicker.

EMBODIMENT FOR CARRYING OUT THE INVENTION

Below, an embodiment of this invention is described in detail.

Figure 1:
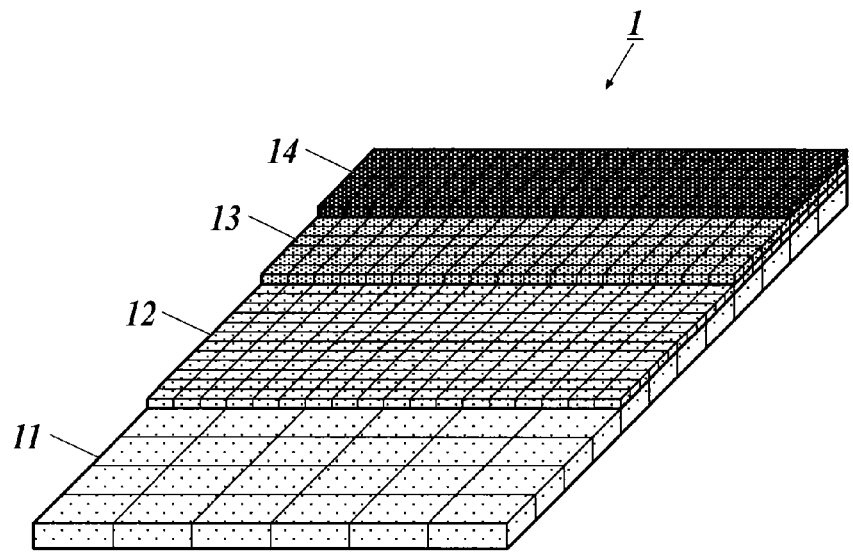
FIG. 1 is a diagram showing a structure of layers of a Y-based superconducting wire according to this embodiment.
Figure 2:
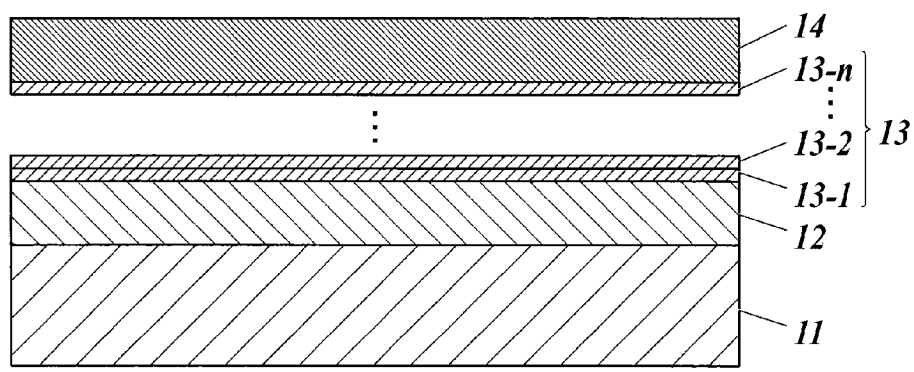
FIG. 2 is a cross-sectional diagram showing a structure of layers of a Y-based superconducting wire according to this embodiment.

FIG. 1 shows a structure of layers of a Y-based superconducting wire 1 according to this embodiment. FIG. 2 shows a cross-sectional diagram of a structure of layers of a Y-based superconducting wire according to this embodiment.

The Y-based superconducting wire 1 includes a metallic substrate 11, an intermediate layer 12, a Y-based superconducting layer 13, and a stabilizing layer 14 layered in order.

The metallic substrate 11 includes an Ni alloy with a thickness of 100 μm. Orientation heat processing is performed in a reducing atmosphere to remove surface oxide film and to set in a biaxial orientation at the same time.

For example, the intermediate layer 12 includes three layers composed of ceria/yttria stabilized zirconia/ceria. The intermediate layer 12 is deposited on the metallic substrate 11 by using an electron beam evaporator, a sputtering apparatus, a PLD (Pulsed Laser Deposition) apparatus and the like on the metallic substrate 11. The intermediate layer 12 is a single layered or a multilayered biaxially oriented layer, and orients the Y-based superconducting layer 13 in a certain direction with the biaxial orientation.

The Y-based superconducting layer 13 includes a Y-based superconductor (YBCO). The Y-based superconductor is a single composition of REBaCuO:RE=(Y, Sc, La, Ce, Pr, Nd, Pm, Sm, Eu, Gd, Tb, Dy, Ho, Er, Tm, Yb, Lu, etc.) or a mixed crystal introducing plural elements.

Figure 5:
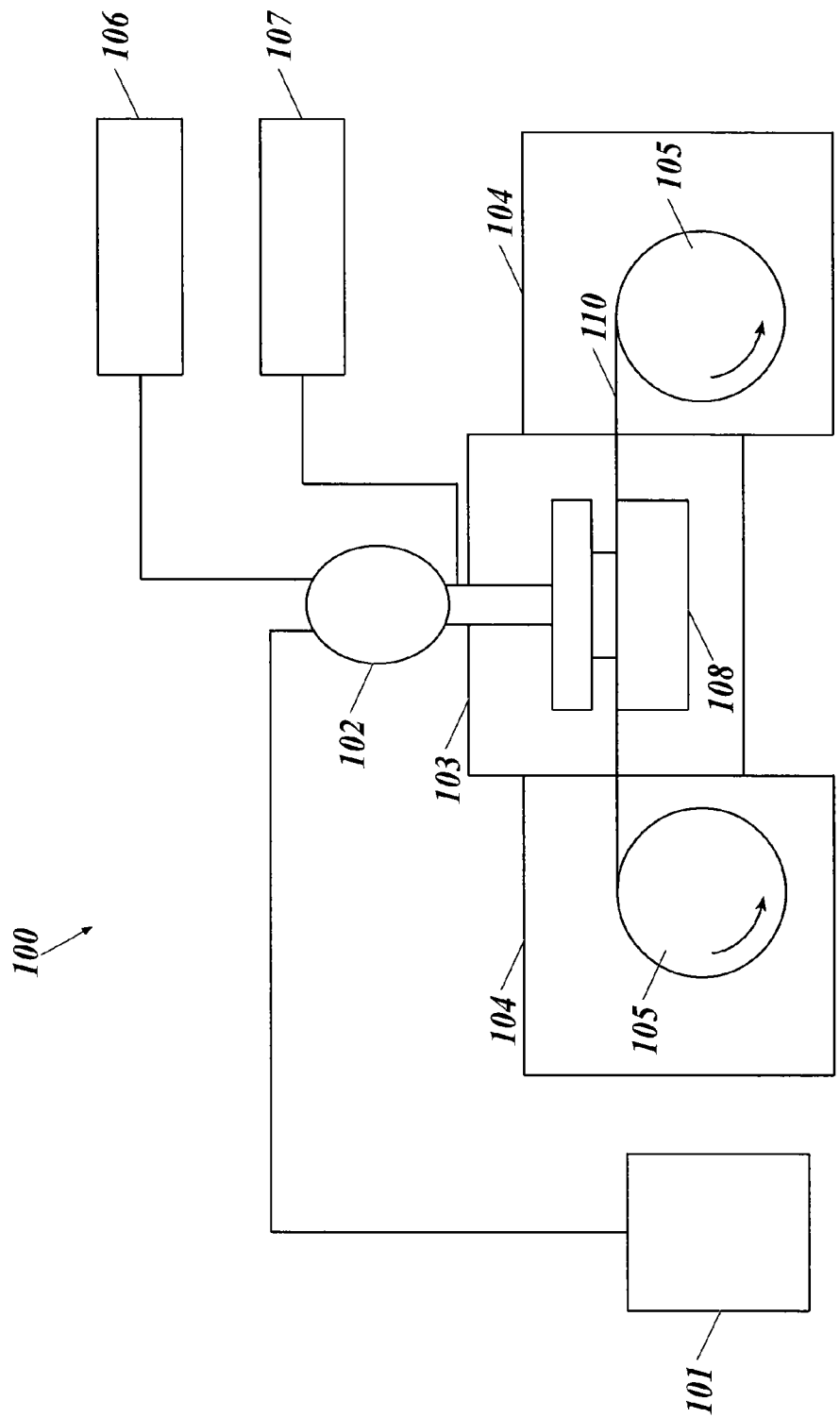
FIG. 5 is a schematic diagram of a configuration of a MOCVD apparatus.

The Y-based superconducting layer 13 is deposited by heating a tape substrate including the metallic substrate 11 and the intermediate layer 12 at a film deposition temperature of 700° C. to 900° C. using a MOCVD apparatus (see FIG. 5). According to this embodiment, as shown in FIG. 2, the Y-based superconducting layer 13 includes n layers of superconducting thin films 13-1, 13-2, ..., 13-n. The film is deposited so that the thickness of one layer of the superconducting thin film is ranging from 10 nm to 200 nm. The n layers of superconducting thin films included in the Y-based superconducting layer 13 is n=about 2 to 200 and the thickness of one layer of the superconducting thin film can be adjusted. Here, it is preferable that the Y-based superconducting layer 13 is 0.5 μm to 5.0 μm.

The stabilizing layer 14 includes silver and is deposited by the sputtering.

According to this embodiment, the Y-based superconducting layer 13 is deposited over a course of plural times, and the Y-based superconducting layer 13 is deposited so that the film thickness of one layer of the superconducting thin film is within the range of 10 nm to 200 nm, preferably within the range of 10 nm to 50 nm. If the film thickness of one layer of the superconducting thin film exceeds 200 nm, the $Cu_xO$ which is a growth factor of the anisotropic crystal increases and the Ic of the Y-based superconducting layer 13 worsens. If the thickness is thinner than 10 nm, the uniformity of the film thickness of the Y-based superconducting layer 13 worsens, and this is not preferable.

The "film thickness of one layer (hereinafter also referred to as one layer film thickness)" is the thickness evaluated including heating the tape substrate to the temperature of 700° C. to 900° C., starting the film deposition of the one layer of the superconducting thin film included in the Y-based superconducting layer 13, and ending the film deposition, and including until the temperature of the substrate falls below the range of the film deposition temperature.

Figure 3:
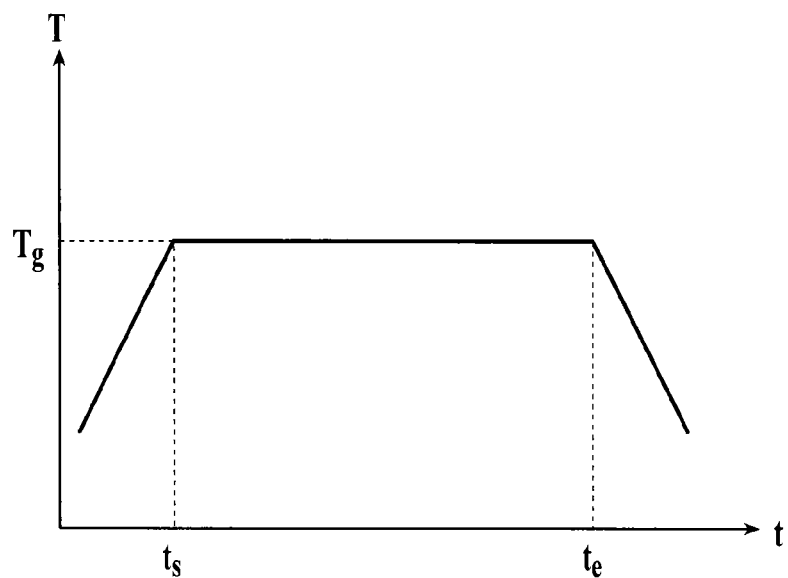
FIG. 3 is a diagram showing a relationship between substrate temperature and time when one layer of a superconducting thin film included in the Y-based superconducting layer is deposited.

FIG. 3 is a diagram showing a relation between the substrate temperature and time when one layer of the superconducting thin film included in the Y-based superconducting layer is deposited.

As shown in FIG. 3, tape substrate 110 is heated with the heater 108 until a temperature T of the tape substrate 110 becomes Tg (700° C. to 900° C.). Then, the film deposition of one layer of the superconducting thin film starts from time is when the temperature T of the tape substrate 110 reaches Tg, and film deposition is performed until time te when film deposition for a length of 200 m of the tape substrate 110 ends. After time te, the temperature T of the tape substrate 110 is lowered. When the temperature T is lowered after the time te, the temperature of the tape substrate 110 should be T<Tg.

The thickness of one layer of the superconducting thin film can be changed by controlling an amount of supply of raw material gas and/or a speed of conveying the tape substrate.

Figure 4:
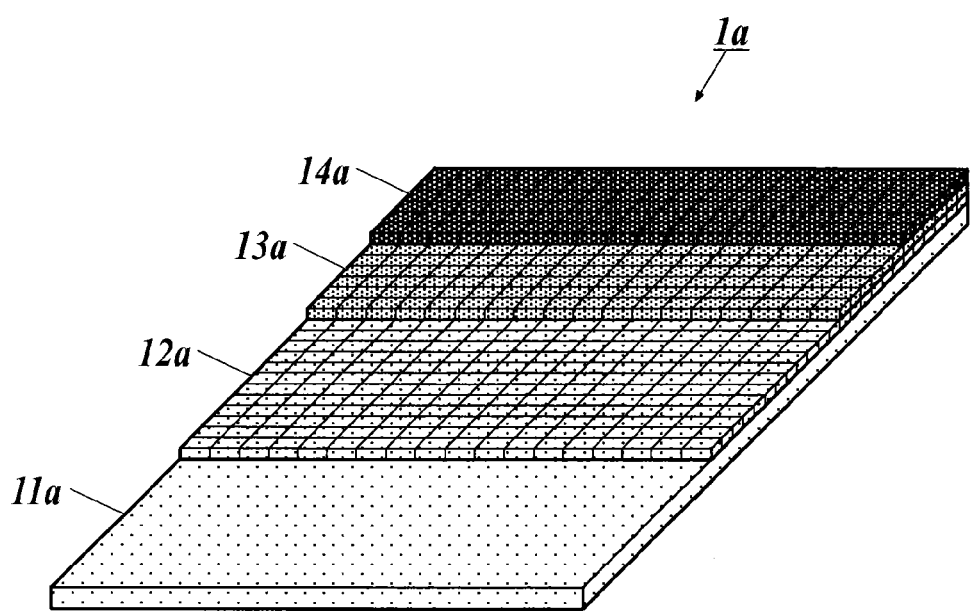
FIG. 4 is a diagram showing a structure of layers of a Y-based superconducting wire according to the modification of this embodiment.

FIG. 4 shows a structure of layers of a Y-based superconducting wire 1a according to a modification of this embodiment.

The structure of layers of the Y-based superconducting wire 1a is similar to the structure of layers of the Y-based superconducting wire 1 shown in FIG. 1.

The metallic substrate 11a includes an alloy with a thickness of 100 μm, and one that is non-oriented is used.

The intermediate layer 12a is a biaxially oriented layer including, for example, two layers composed of ceria/yttria stabilized zirconia. The intermediate layer 12a is deposited on the metallic substrate 11a by using the sputtering apparatus using ion beam assistance called IBAD (ion beam assisted deposition). Then, the intermediate layer 12a can be further deposited by the sputtering apparatus or the PLD apparatus and can consist of plural layers.

The Y-based superconducting layer 13 includes a Y-based superconductor (YBCO). The Y-based superconductor is a single composition of REBaCuO:RE=(Y, Sc, La, Ce, Pr, Nd, Pm, Sm, Eu, Gd, Tb, Dy, Ho, Er, Tm, Yb, Lu, etc.) or a mixed crystal introducing plural elements. Further, W, Sn, Hf, Zr, Nb, Ta, Ti, and Ir can be introduced as a pinning center to enable high superconducting properties in a magnetic field.

The Y-based superconducting layer 13a is deposited by the MOCVD with heating a tape substrate including the metallic substrate 11a and the intermediate layer 12a at a film deposition temperature of 700° C. to 900° C. (see FIG. 5). According to this embodiment, the Y-based superconducting layer 13a is deposited over a course of plural times, and the Y-based superconducting layer 13a is deposited so that the film thickness of one layer of the superconducting thin film is within the range of 10 nm to 200 nm, preferably within the range of 10 nm to 50 nm. If the film thickness of one layer of the superconducting thin film exceeds 200 nm, the $Cu_xO$ which is a growth factor of the anisotropic crystal increases and the Ic of the Y-based superconducting layer 13a worsens. If the film thickness is thinner than 10 nm, the uniformity of the film thickness of the Y-based superconducting layer 13a worsens, and this is not preferable. The "film thickness of one layer" is defined similarly as described above.

The stabilizing layer 14a includes silver and is deposited by the sputtering.

As described above, the film deposition method and configuration of the Y-based superconducting wire 1a which is another example are basically the same as those of the Y-based superconducting wire. In the description below, the Y-based superconducting wire 1 is described as an example.

FIG. 5 shows a schematic configuration of the MOCVD apparatus 100.

The MOCVD apparatus 100 includes a raw material supplying unit 101, a vaporizer 102, a reactor 103, a substrate conveying unit 104, a tape winding unit 105, a carrier gas supplying unit 106, an oxygen gas supplying unit 107, and a heater 108.

The raw material supplying unit 101 supplies a raw material solution to the vaporizer 102, and the carrier gas supplying unit 106 supplies carrier gas such as Ar, etc. to the vaporizer 102. The organic compound raw materials of Y, Ba, and Cu are added at a desired ratio to be dissolved in THF (tetrahydrofuran) as a solvent, and this is used as the raw material solution. According to this embodiment, the ratio of the organic compound raw material is adjusted to be $Y_1Ba_{1.0-2.0}Cu_{2.0-3.0}O_y$.

The vaporizer 102 sprays the raw material solution in the supplied carrier gas to generate the raw material gas. The vaporizer 102 introduces the generated raw material gas and $O_2$ supplied from the oxygen gas supplying unit 107 through the introducing pipe to the reactor 103.

The reactor 103 deposits by vapor deposition the raw material gas introduced by the vaporizer 102 on a surface of a tape substrate 110 in which the intermediate layer 12a is deposited on the metallic substrate 11a, and the Y-based superconducting layer 13a is deposited.

For example, a non-oriented Hastelloy with a thickness of 100 μm, a width 10 mm, and a length 200 m is used as the metallic substrate 11a of the tape substrate 110. The intermediate layer 12a is deposited on the metallic substrate 11a with the IBAD.

The substrate conveying unit 104 moves the tape substrate 110 in the reactor 103 at a predetermined speed.

The heater 108 controls the temperature of the tape substrate 110. For example, the heater 108 controls the heating so that the temperature of the tape substrate 110 is within the range of 700° C. to 900° C.

As described above, the MOCVD apparatus 100 controls the temperature of the tape substrate 110 while moving the tape substrate 110 and the Y-based superconducting layer 13 is deposited. Here, when the film deposition is performed in a state where the temperature of the tape substrate is lower than 700° C., there is a problem that the anisotropic crystal in which the superconducting current does not flow mainly grows, and the superconducting layer in which the superconducting current does not flow is formed. Alternatively, when the film deposition is performed in a state where the temperature is higher than 900° C., there is a problem that a reaction occurs between the superconducting layer and the intermediate layer, and the superconducting properties decrease. There is also a problem that since the growth temperature is too high, forming the superconducting layer itself becomes difficult. Therefore, it is preferable to deposit the Y-based superconducting layer 13 in a state where the temperature of the tape substrate 110 is within 700° C. to 900° C.

According to this embodiment, the features of deposition of the Y-based superconducting layer 13 by the MOCVD are, (1) the deposition of the Y-based superconducting layer 13 is divided to be performed over a course of plural times, (2) the film thickness of one layer of the superconducting film is thin, and (3) the temperature of the tape substrate 110 is lowered after one layer of the superconducting film of the Y-based superconducting layer 13 is deposited. With such steps, the forming of $Cu_xO$ and the polycrystalline structure can be prevented, the growth of the anisotropic crystal with $Cu_xO$ as the core can be prevented, and the crystallinity of the Y-based superconducting layer 13 can be enhanced.

Figure 6:
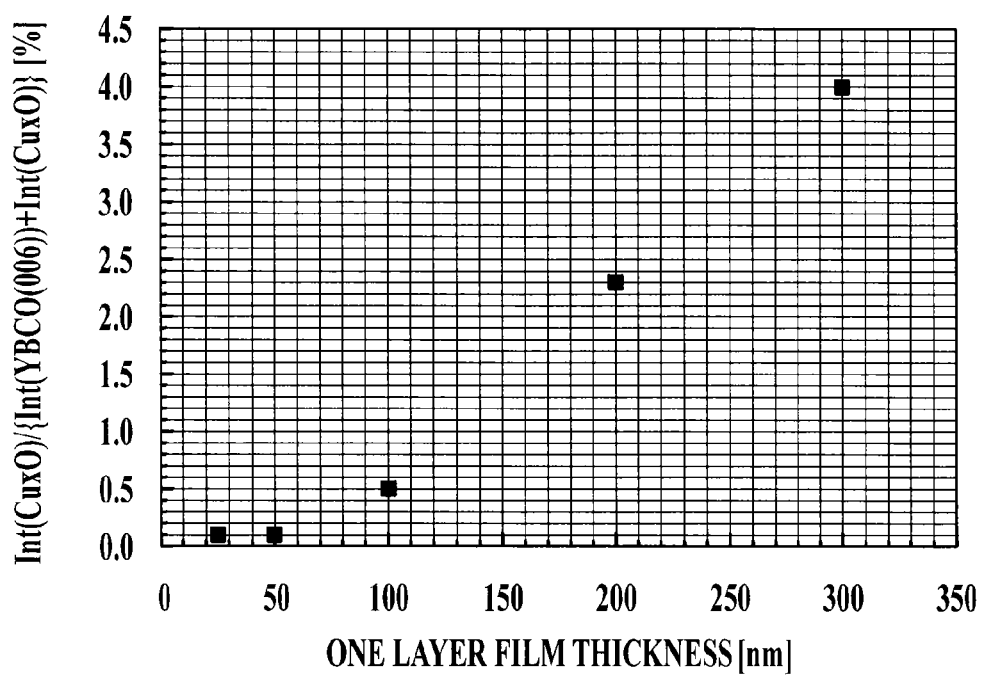
FIG. 6 is a diagram showing evaluation by an X-ray diffraction (XRD) of a Y-based superconducting layer when a film thickness of one layer of the Y-based superconducting layer is changed.

FIG. 6 shows evaluation by X-ray diffraction (XRD) of the Y-based superconducting layer 13 when the one layer film thickness of the Y-based superconducting layer 13 was changed. In FIG. 6, the total film thickness of the superconducting layer is fixed to 1 μm, and one layer film thickness dependency of a percentage of the anisotropic crystal is indicated.

A horizontal axis of FIG. 6 shows the one layer film thickness (film thickness of each single layer) of the superconducting layer deposited over a course of plural times.

In the vertical axis of FIG. 6, Int(YBCO(0006)) shows intensity of (0006) crystal orientation of the superconducting layer, and Int(CuxO) shows intensity of CuxO which is the anisotropic crystal. Int(CUxO)/(Int(YBCO(006))+Int (CuxO)) shows the percentage of CuxO, which is the anisotropic crystal, included in the superconducting layer (YBCO layer) as an intensity ratio.

As shown in FIG. 6, when the final total film thickness is fixed and the one layer film thickness is made thinner in deposition of the Y-based superconducting layer 13 by the MOCVD, peak intensity of $Cu_xO$ can be reduced. Here, when the one layer film thickness exceeds 200 nm, the peak intensity of $Cu_xO$ exceeds 2.5% and $Cu_xO$ becomes a core of the anisotropic crystal. Since this becomes a growth factor of the anisotropic crystal, this is not preferable. It is preferable that the one layer film thickness is 100 nm or less which is the thickness that the peak intensity of $Cu_xO$ becomes 0.5% or less. Further, it is desirable that the one layer film thickness is 50 nm or less which is the thickness that the peak intensity of $Cu_xO$ becomes almost 0%.

Figure 7:
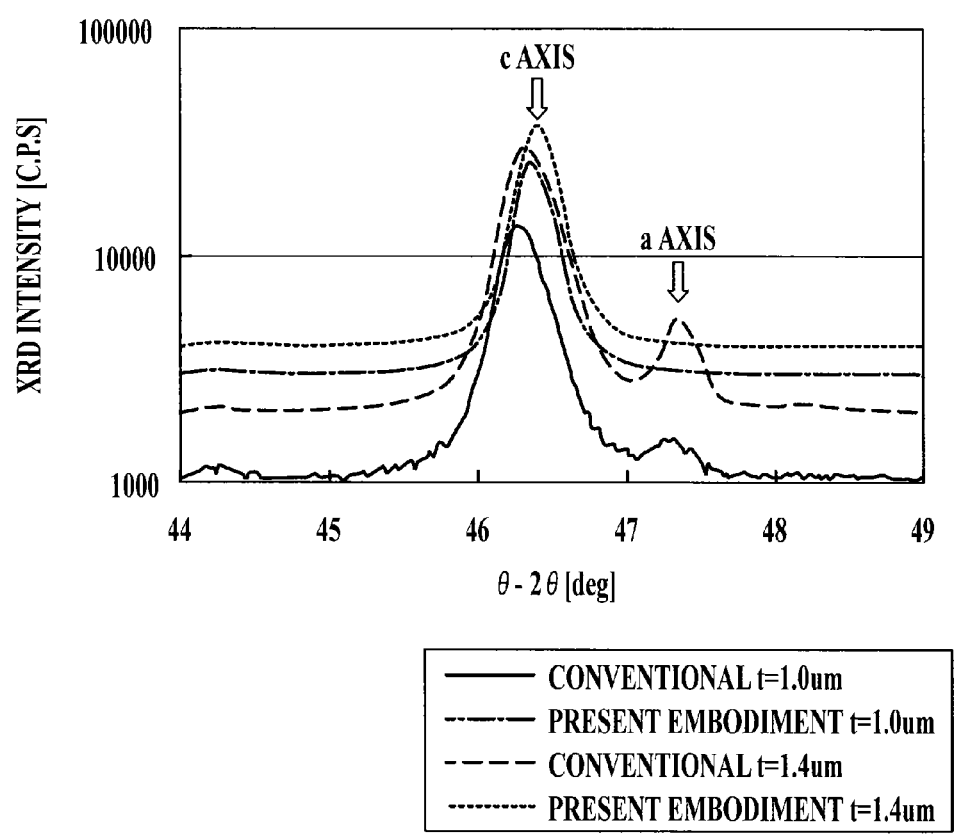
FIG. 7 is a diagram showing a comparison of crystallinity.

FIG. 7 is a diagram showing a comparison of crystallinity.

The crystallinity shown in FIG. 7 are crystallinity of the Y-based superconducting layer 13 deposited by the film deposition method of this embodiment and the crystallinity of the Y-based superconducting layer deposited by the conventional film deposition method.

The film deposition method of this embodiment is the film deposition method including the above described features of (1) to (3), and the conventional film deposition method is the film deposition method in which the Y-based superconducting layer is deposited in one time. Two types of the total film thickness (t) are provided, 1.0 μm and 1.4 μm.

As shown in FIG. 7, compared to film deposition with the conventional film deposition method, the a-axis oriented crystal which is the anisotropic crystal decreases in film deposition by the film deposition method of this embodiment. When the total film thickness (t) is made thicker from 1.0 μm to 1.4 μm, it is possible to understand that the a-axis oriented crystal which is the anisotropic crystal decreases and the crystallinity is enhanced with film deposition by the film deposition method of this embodiment.

From the above results, by suppressing $Cu_xO$, the anisotropic crystal with $Cu_xO$ as the core can be reduced.

Figure 8:
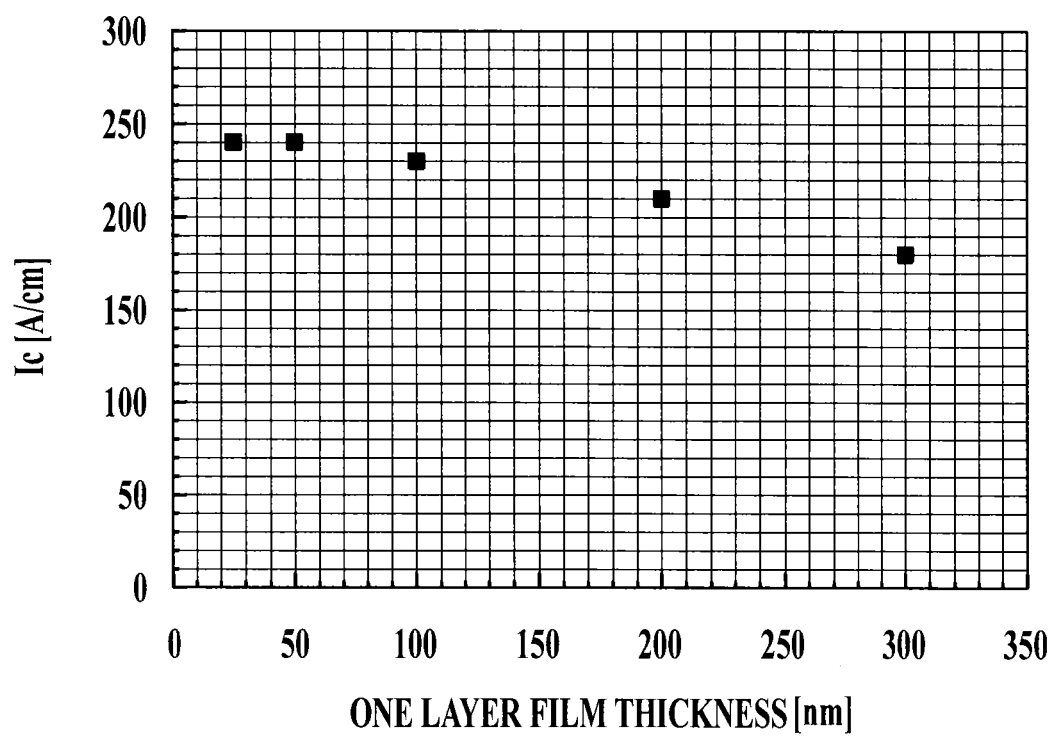
FIG. 8 is a diagram showing an Ic when a total film thickness of the Y-based superconducting layer is fixed to 1 μm and the film thickness of one layer is changed.

FIG. 8 shows an Ic when the total film thickness of the Y-based superconducting layer 13 is fixed to 1 μm and the one layer film thickness is changed. Ic (A/cm) in the vertical axis of FIG. 8 shows the Ic converted with the total film thickness as 1 μm. The one layer film thickness (film thickness of one layer) is set to 25 nm, 50 nm, 100 nm, 200 nm, and 300 nm.

As shown in FIG. 8, when the Y-based superconducting layer 13 is deposited under the condition that the film thickness of one layer is made thinner, the Ic can be enhanced in the same total film thickness. The Ic in the case the film thickness of one layer is 25 nm and 50 nm does not largely change and is favorable. When the film thickness of one layer is 100 nm, the Ic slightly decreases. If the film thickness of one layer is thinner than 10 nm, the uniformity of the film thickness worsens and is not preferable. According to the above, it is more preferable that the film thickness of one layer is within the range of 10 nm to 50 nm.

Figure 9:
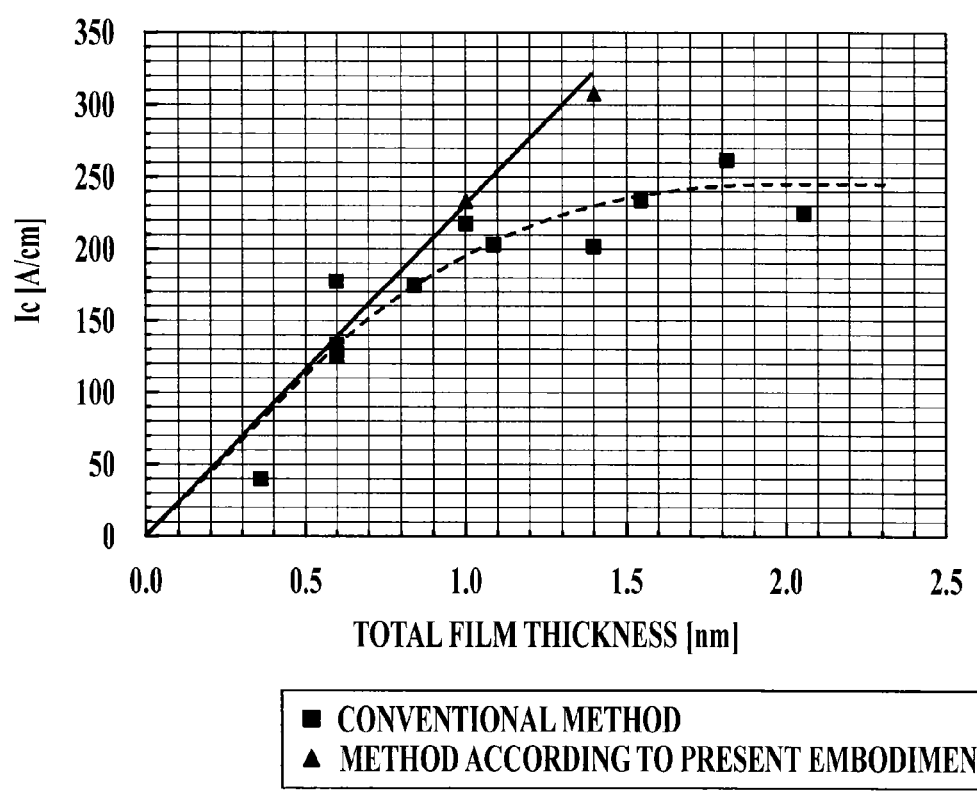
FIG. 9 is a diagram showing a comparison between Ics when films are deposited with the film deposition method of this embodiment and Ic when a film is deposited with the conventional film deposition method.

FIG. 9 is a diagram showing a comparison between Ic when a film is deposited with the film deposition method of this embodiment and Ic when a film is deposited with the conventional film deposition method.

In the film deposition of the film deposition method of this embodiment, the film thickness of one layer is 10 nm to 50 nm (see FIG. 8). As shown in FIG. 9, the Ic when the total film thickness is 1 μm slightly improves when the film is deposited by the film deposition method of this embodiment than when the film is deposited by the conventional film deposition method. The Ic when the total film thickness is 1.4 μm greatly increases without the Ic saturating when the film is deposited by the film deposition method of this embodiment. If the total film thickness of the superconducting layer is thicker than 5.0 μm, this is not realistic for manufacturing and is therefore not preferable. Therefore, it is preferable that the total film thickness of the superconducting layer is 5.0 μm or less.

In the film deposition of the Y-based superconducting layer 13, evaluation by the TEM is effective for research of the film thickness of one layer. When the superconducting layer is deposited as a multilayer film, a thin film layer of $REO_x$, such as $Y_2O_3$, $Gd_2O_3$, etc. may be formed between the layers. By measuring the film thickness between the layers with the $REO_x$ layer, the one layer film thickness in the deposition of the superconducting layer can be measured. Here, $REO_x$ includes elements of REBaCuO:RE=(Y, Sc, La, Nd, Pm, Sm, Eu, Gd, Dy, Ho, Er, Tm, Yb, Lu, etc.), and RE can be a single composition or a plural composition in the group.

INDUSTRIAL APPLICABILITY

This invention can be applied to the field of superconducting devices such as superconducting cables and superconducting magnets.

DESCRIPTION OF REFERENCE NUMERALS 1, 1a Y-based superconducting wire
11, 11a metallic substrate
12, 12a intermediate layer
13, 13a Y-based superconducting layer
14, 14a stabilizing layer
100 MOCVD apparatus
101 raw material supplying unit
102 vaporizer
103 reactor
104 substrate conveying unit
105 tape winding unit
106 carrier gas supplying unit
107 oxygen gas supplying unit
108 heater

The invention claimed is:

1. A method for manufacturing a superconducting wire in which a superconducting layer is formed above a metallic substrate with an intermediate layer in between, the method comprising:
heating the metallic substrate to a film deposition temperature of a superconducting thin film which forms the superconducting layer;
depositing the superconducting thin film with a thickness of 10-50 nm on the intermediate layer; and
cooling the metallic substrate temperature below the film deposition temperature of the superconducting thin film,
wherein forming the superconducting thin film which includes the heating, the depositing, and the cooling is performed plural times.

2. The method for manufacturing the superconducting wire according to claim 1, wherein a temperature of heating the metallic substrate in the heating is 700-900° C.

3. The method for manufacturing the superconducting wire according to claim 1, wherein the superconducting thin film is formed by Metal Organic Chemical Vapor Deposition.

4. The method for manufacturing the superconducting wire according of claim 1, wherein the superconducting layer becomes 0.5 μm to 5.0 μm by performing the forming of the superconducting thin film plural times.

5. The method for manufacturing the superconducting wire according to claim 1, wherein the metallic substrate is non-oriented.

* * * * *